(12) United States Patent
Tanisaka

(10) Patent No.: US 10,403,793 B2
(45) Date of Patent: Sep. 3, 2019

(54) METHOD OF FORMING NANORODS AND METHOD OF MANUFACTURING SEMICONDUCTOR ELEMENT

(71) Applicant: NICHIA CORPORATION, Anan-shi, Tokushima (JP)

(72) Inventor: Shingo Tanisaka, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/663,323

(22) Filed: Jul. 28, 2017

(65) Prior Publication Data

US 2018/0033917 A1 Feb. 1, 2018

(30) Foreign Application Priority Data

Aug. 1, 2016 (JP) .................. 2016-151072
Sep. 26, 2016 (JP) .................. 2016-187032

(51) Int. Cl.
*H01L 21/3065* (2006.01)
*H01L 21/308* (2006.01)
(Continued)

(52) U.S. Cl.
CPC .......... *H01L 33/32* (2013.01); *H01L 21/3065* (2013.01); *H01L 21/677* (2013.01);
(Continued)

(58) Field of Classification Search
CPC ..... H01L 21/2633; H01L 21/308–3088; H01L 21/3065; H01L 21/30655; H01L 21/31055; H01L 21/31056; H01L 21/31105; H01L 21/31116; H01L 21/31138; H01L 21/31122; H01L 21/67069; H01L 21/677;
(Continued)

(56) References Cited

U.S. PATENT DOCUMENTS 7,781,796 B2 * 8/2010 Masui ................. B82Y 20/00
257/103
2008/0191191 A1 8/2008 Kim
(Continued)

FOREIGN PATENT DOCUMENTS

JP 2008-544567 A 12/2008
JP 2010-225775 A 10/2010
JP 2014-509075 A 4/2014

*Primary Examiner* — Natalia A Gondarenko
(74) *Attorney, Agent, or Firm* — Foley & Lardner LLP

(57) ABSTRACT

A method of forming semiconductor nanorods includes: placing, in a chamber, a masking material and a base comprising a semiconductor, wherein an etching rate of the masking material in a chemical reaction with a reactant gas during dry etching is lower than an etching rate of a semiconductor in a chemical reaction with the reactant gas during dry etching; and performing dry-etching to form a plurality of dot-masks, each having a form of a dot containing the masking material, on a surface of the semiconductor and to remove a portion of the semiconductor exposed from the dot-masks, wherein the dry-etching is performed under a pressure in the chamber in a predetermined range that allows the masking material scattered by the etching to be adhered to a surface of the semiconductor with a predetermined size of the dots and a predetermined density of the dots.

16 Claims, 8 Drawing Sheets

(51) Int. Cl.

| | | |
|---|---|---|
| *H01L 21/673* | (2006.01) | |
| *H01L 33/00* | (2010.01) | |
| *H01L 33/08* | (2010.01) | |
| *H01L 33/18* | (2010.01) | |
| *H01L 33/30* | (2010.01) | |
| *H01L 33/32* | (2010.01) | |
| *H01L 33/44* | (2010.01) | |
| *H01L 33/42* | (2010.01) | |
| *H01L 21/677* | (2006.01) | |
| *H01L 33/22* | (2010.01) | |
| *H01S 5/34* | (2006.01) | |
| *H01L 33/40* | (2010.01) | |
| *H01S 5/32* | (2006.01) | |
| *H01S 5/343* | (2006.01) | |

(52) U.S. Cl.
CPC .......... *H01L 33/005* (2013.01); *H01L 33/007* (2013.01); *H01L 33/0062* (2013.01); *H01L 33/0095* (2013.01); *H01L 33/08* (2013.01); *H01L 33/18* (2013.01); *H01L 33/22* (2013.01); *H01L 33/42* (2013.01); *H01L 33/44* (2013.01); *H01S 5/341* (2013.01); *H01L 33/405* (2013.01); *H01L 2933/0083* (2013.01); *H01S 5/3216* (2013.01); *H01S 5/3407* (2013.01); *H01S 5/34333* (2013.01)

(58) Field of Classification Search
CPC ......... H01L 33/32; H01L 33/44; H01L 33/42; H01L 33/08; H01L 33/18; H01L 33/0062; H01L 33/005; H01L 31/035218; H01L 31/035227; H01L 33/405; H01L 33/22; H01L 33/007; H01L 33/0095; H01L 2933/0083; H01L 2933/0091; H01L 21/3085; H01L 21/3086; H01L 21/3081; H01L 21/30604
USPC ....... 438/565, 707, 746, 766, 945, 964, 497, 438/29, 47; 257/E33.005, E21.232, 257/E21.235, E21.582, E21.159, E21.218, 257/E33.025, E33.028, E33.074
See application file for complete search history.

(56) References Cited

U.S. PATENT DOCUMENTS

| | | | |
|---|---|---|---|
| 2008/0268288 A1* | 10/2008 | Jin | ................. B81C 1/00031 428/800 |
| 2010/0220757 A1* | 9/2010 | Kitagawa | ............... H01L 33/22 372/44.01 |
| 2011/0227037 A1* | 9/2011 | Su | ...................... C23C 16/0227 257/13 |
| 2014/0038320 A1 | 2/2014 | Wang | |
| 2017/0110330 A1* | 4/2017 | Choi | ................. H01L 31/02363 |

* cited by examiner

Fig.3
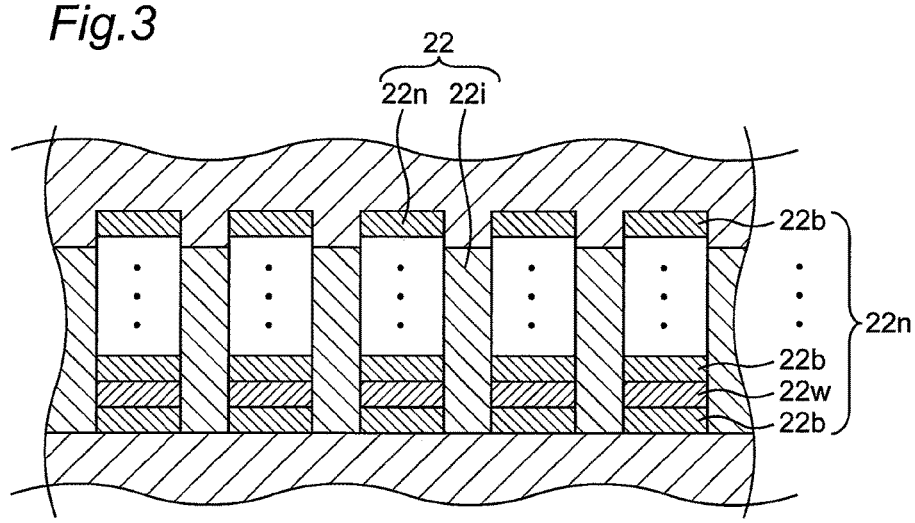
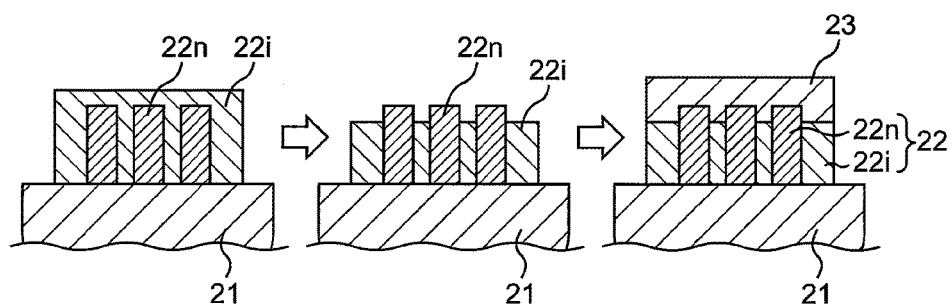
Fig.4A  Fig.4B  Fig.4C

*Fig.5*
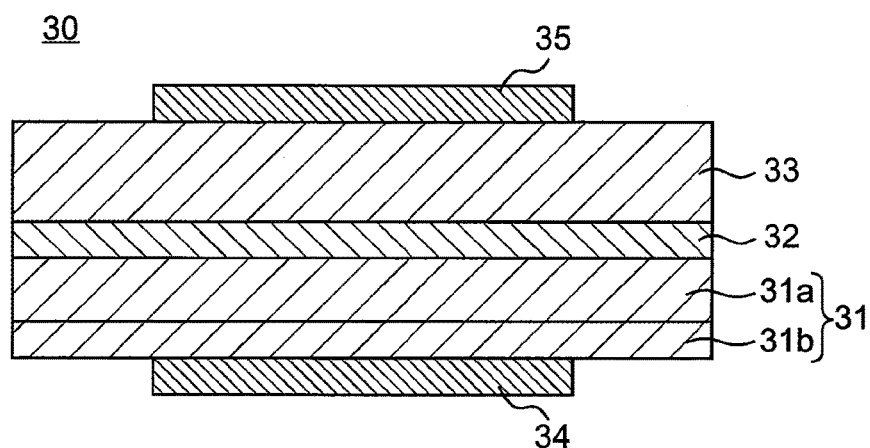
*Fig.6A*  *Fig.6B*  *Fig.6C*
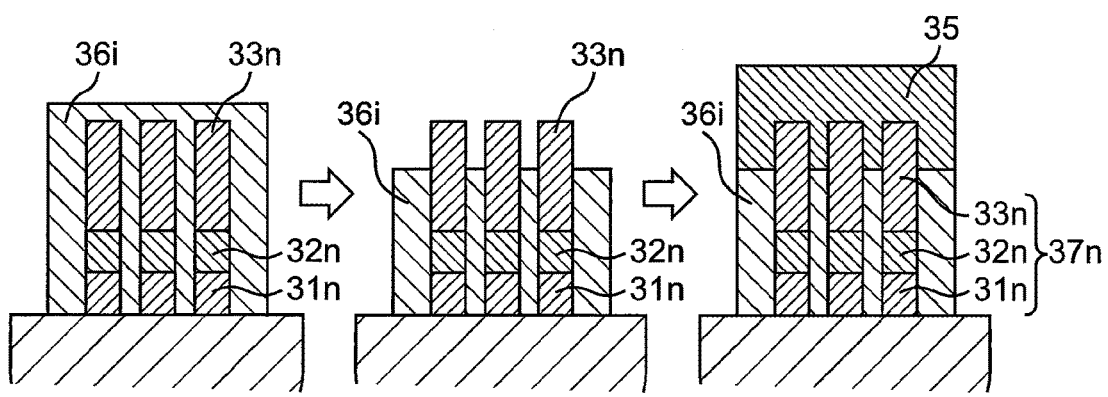

METHOD OF FORMING NANORODS AND METHOD OF MANUFACTURING SEMICONDUCTOR ELEMENT

CROSS-REFERENCE TO RELATED APPLICATIONS

This application claims priority to Japanese Patent Application No. 2016-151072, filed on Aug. 1, 2016, and Japanese Patent Application No. 2016-187032, filed on Sep. 26, 2016, the contents of which are hereby incorporated by reference in their entireties.

BACKGROUND

The present disclosure relates to a method of forming nanorods and a method of manufacturing a semiconductor element.

In the field of semiconductor elements such as electronic devices and optical devices, due to development of semiconductor materials such as nitride semiconductors and progress in manufacturing technology, high quality semiconductor elements have been realized. In recent years, efforts to achieve further miniaturization and higher efficiency have been made by, for example, using nanorods having a diameter or width of 100 nm or less, which allows for improving internal quantum efficiency due to quantum confinement effects and strain relaxation effects.

Methods of forming the nanorods are roughly classified into a bottom-up method employing crystal growth and a top-down method employing etching. Japanese Patent Publication No. 2008-544567 disclose a method of forming nanorods made of GaN in a bottom-up manner. In this method of forming nanorods, lateral growth is suppressed by adjusting crystal growth conditions such as the temperature, pressure, and flow rates of precursors of Ga and N to grow GaN upward. Also, Japanese Patent Publication No. 2014-509075 discloses a top-down method of forming nanorods made of a nitride semiconductor. In this method, nanorods made of a nitride semiconductor are formed by forming a mask in a form of islands on a nitride semiconductor layer and removing a portion of the nitride semiconductor between the islands of the mask. The mask on the nitride semiconductor includes two layers: a nickel layer and a silicon oxide layer.

SUMMARY

However, in the bottom-up method employing crystal growth, the shape of nanorods to be obtained may be varied due to changes or fluctuations in configurations of the crystal growth conditions. Also, in the bottom-up method employing crystal growth, control of the shape of nanorods is difficult, so that mass production may be difficult.

Examples of the top-down method employing etching include a method including forming, for example, a two-layered mask pattern corresponding to the shape of nanorods as disclosed in, for example, Japanese Patent Publication No. 2014-509075. In this method, a metal layer automatically formed into a minute size by annealing is used as a second mask to form a first mask into a minute pattern. However, with such a method, the number of steps, such as annealing, etching, and removing of the masks, is increased, so that manufacturing may not be inexpensively performed. Further, because the nanorods disclosed in this publication have a size of 100 to 1,000 nm in diameter, formation of nanorods with a small diameter may not be easy by using the method in this publication.

In view of the above, one object of this disclosure is provide a method of forming nanorods that allows for controlling the shape of the nanorods with a simple process, and a method of manufacturing a semiconductor element employing the method of forming nanorods.

A method of forming nanorods according to one embodiment includes placing, in a chamber, a masking material and a base comprising the semiconductor, the masking material having an etching rate in a chemical reaction with a reactant gas during dry etching that is lower than an etching rate of a semiconductor in a chemical reaction with the reactant gas during dry etching; and performing dry-etching to form a plurality of dot-masks in a form of dots each containing the masking material on a surface of the semiconductor and to remove a portion of the semiconductor exposed from the dot-masks, the dry-etching performed under a pressure in the chamber in a predetermined range that allows the masking material scattered by the etching to be adhered to a surface of the semiconductor with a predetermined size of the dots and a predetermined density of the dots.

With the method of forming nanorods according to this embodiment, the shape of the nanorods to be formed can be controlled with a simple process.

BRIEF DESCRIPTION OF THE DRAWINGS

FIG. 3 is a schematic enlarged cross-sectional view of a portion of FIG. 2.

FIGS. 4A to 4C are schematic cross-sectional views illustrating forming of an active layer containing nanorods in the semiconductor element according to the third embodiment.

FIG. 5 is a schematic sectional view of a semiconductor element according to a fourth embodiment of the present invention.

FIGS. 6A to 6C are schematic cross-sectional views illustrating forming of an active layer containing nanorods each including an n-side-semiconductor rod portion, an active-layer rod portion, and a p-side-semiconductor rod portion in the semiconductor element according to the fourth embodiment.

DETAILED DESCRIPTION

Figure 1:
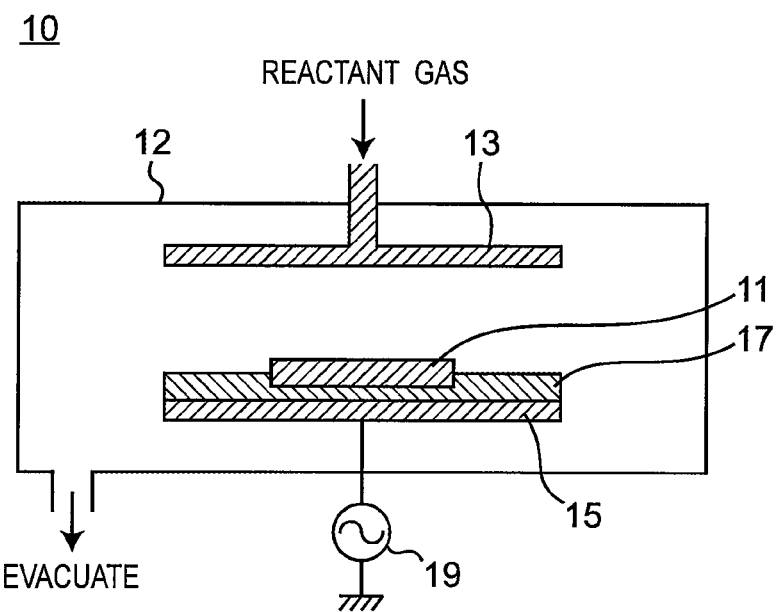
FIG. 1 is a schematic diagram illustrating a constitution of a dry-etching apparatus for performing a method of forming semiconductor nanorods according to a first embodiment of the present invention.

The inventor of the present application has found that, with certain predetermined dry-etching conditions, masks can be formed on a semiconductor and the semiconductor can be etched using the masks during a continuous dry-etching step. Furthermore, the inventor of the present application intensively studied and has found that, by changing conditions of dry etching, particularly the pressure value, the shape and density of nanorods to be formed can be changed in accordance with changes in conditions of dry etching, particularly the pressure value.

The reason that the above phenomena occur is considered to be as described below.

First, in an early stage of dry etching under certain conditions, chemical reactions of a reactant gas with the semiconductor are greatly reduced due to, for example, a low temperature of the surface of the semiconductor. Accordingly, in the early stage of dry etching, etching rates based on the chemical reactions are decreased, and an amount of reaction products generated by the chemical reactions of the reactant gas with the semiconductor is reduced. On the other hand, because an amount of scattered materials such as the reaction products is reduced in the early stage of dry etching, the collision frequency of reactant gas particles in plasma with the scattered materials is decreased, and thus the mean free path of the reactant gas particles is increased. Accordingly, the reactant gas maintaining high kinetic energy in plasma is applied to the semiconductor and a masking material, and thus physical etching progresses. Therefore, physical etching is comparatively active in the early stage of dry etching, and the masking material scattered by physical etching adheres to the surface of the semiconductor to form the masks.

As etching progresses, a temperature of the semiconductor is increased due to heat generated by the chemical reactions of the reactant gas with the semiconductor, which increases the etching rates in the chemical reactions of the reactant gas with the semiconductor and increases the amount of the scattered materials such as the reaction products generated by the chemical reactions. On the other hand, increase in the amount of the scattered materials such as the reaction products allows for increasing the collision frequency of the reactant gas particles with the scattered materials and shortening the mean free path of the reactant gas particles, so that physical etching rates are decreased. Accordingly, in this stage, etching caused by the chemical reactions of the reactant gas with the semiconductor is dominant, so that the masking material that has adhered to the surface of the semiconductor serves as masks, and the semiconductor is removed except for portions of the semiconductor below the masks. In this manner, nanorods are formed.

According to the above consideration, in order to allow the masking material to adhere to the surface of the semiconductor to be masks in a form of nano-sized dots, a material in a shape of particles each having a size of, for example, 10 nm to 200 nm that can be scattered by physical etching is preferably used for the masking material. Meanwhile, the masking material is required to function as the masks during dry etching of the semiconductor based on the chemical reactions with the reactant gas. For this reason, the masking material is required to have an etching rate based on the chemical reaction with the reactant gas lower than that of the semiconductor. For example, a material that substantially does not chemically react with the reactant gas, such as a material that allows the mask left on the surface of the semiconductor after completion of etching, is more suitable.

The embodiments described below have been devised based on the above mechanisms discovered by the present inventor.

First Embodiment

In a method of forming semiconductor nanorods according to a first embodiment of the present invention, without changing conditions of dry-etching that are initially set, masks in the form of dots (i.e., dot-masks) are formed in a dry-etching step and a semiconductor layer is etched using the masks. The method of forming semiconductor nanorods in the first embodiment can be performed with a common dry-etching apparatus schematically shown in FIG. 1, and does not require separately forming the mask, and therefore the semiconductor nanorods can be inexpensively and easily formed.

A dry-etching apparatus 10 in FIG. 1 includes a chamber 12 housing an upper electrode 13, a lower electrode 15, and a wafer table 17 and a high-frequency power supply 19. A base 11 is disposed on the wafer table 17.

The method of forming semiconductor nanorods according to the first embodiment will be described in detail below, and includes the following steps.

Masking Material and Base Providing Step

In the present step, a masking material and a base containing a semiconductor (semiconductor layer) that will be the nanorods after etching are placed in the chamber. For the masking material, a material that can be physically etched and has an etching rate based on the chemical reactions with the reactant gas during dry etching lower than that of the semiconductor is selected. A material that hardly reacts chemically with reactant gases commonly used in dry etching of semiconductor materials is preferably selected for the masking material. Examples of the material that hardly reacts chemically with reactant gases used in dry etching of semiconductor materials include yttria and zirconia. The masking material may be disposed around the base on the wafer table 17, on which the base is placed, or the wafer table 17 may be made of the masking material. That is, a tray such as the wafer table 17 may be the source of the masking material. With this constitution, it is not required that the masking material is disposed in the chamber of the dry-etching apparatus in a separate step.

Examples of the material of the semiconductor layer include various semiconductors such as group IV (such as Si and Ge) semiconductors, nitride semiconductors, and group III-V semiconductors such as gallium arsenide semiconductors and gallium phosphide semiconductors. For example, one or more semiconductors of GaN, AlGaN, and InGaN may be used for the semiconductor layer. In the case of using such semiconductors, using a chlorine-based gas such as the $Cl_2$ gas or the $SiCl_4$ gas for the reactant gas allows the etching rate of such a semiconductor layer in dry etching to be larger than the etching rate of yttria or zirconia.

Dry-Etching Step

In the chamber in which the masking material and the base including the semiconductor layer are placed, dry etching is performed with a reactant gas suitable for dry etching (more specifically, reactive ion etching) of the semiconductor constituting the semiconductor layer. The etching conditions are selected so that the masking material scattered by etching adheres to a surface of the semiconductor layer so as to be in a form of dots with a predetermined size and a predetermined density in an early stage of etching. The pressure in the chamber should be controlled to allow the masking material to be adhered to the surface of the semiconductor layer so as to be in a form of dots with the predetermined size and the predetermined density. For example, parameters other than the pressure should be set to values within predetermined ranges and the pressure in the chamber should be adjusted to allow the masking material to adhere to the surface of the semiconductor layer into a form of dots with a desired size and a desired density of the dots.

For example, the size of the scattered masking material particles tends to increase when the pressure in the chamber 12 is decreased. Accordingly, the pressure in the chamber 12 is decreased in the case of forming masks with a comparatively large diameter, that is, in the case of increasing the diameter of the nanorods to be formed. Conversely, the pressure in the chamber 12 can be increased in the case of forming masks with a comparatively small diameter, that is, in the case of decreasing the diameter of the nanorods to be formed. Also, decreasing the pressure in the chamber 12 tends to allow the number of scattered masking material particles and the density of the masks formed on the semiconductor layer to be decreased. In view of the relation of the pressure in the chamber 12 to the size and number of the scattered masking material particles in the above, the pressure in the chamber 12 is selected so that the masking material is adhered to a surface of the semiconductor layer to be a form of dots with a desired size and a desired density of the dots.

The pressure in the chamber 12 is selected from a range of, for example, 0.5 to 20 Pa, preferably a range of more than 1 Pa to 10 Pa.

Further, it may be comparatively difficult to allow the masking material to adhere to the surface of the semiconductor layer with a desired size and a desired density by only selecting the pressure in the chamber 12 in a range as described above. In such a case, changing other parameters such as the output power and the flow rate of the reactant gas as well as the pressure allows the masking material to adhere to the surface of the semiconductor layer with a desired size and a desired density of the dots.

For example, increasing the output power of the reactant gas allows the size of the scattered masking material particles to be decreased. This is because, by increasing the output power, kinetic energy of the reactant gas particles is increased, and such reactant gas particles collide with the masking material particles.

For example, decreasing the flow rate of the reactant gas allows for increasing the number of the masking material particles deposited on the surface of the semiconductor layer. This is because, by decreasing the flow rate of the reactant gas, the flow of the masking material particles around the semiconductor layer is slowed down, and the masking material particles is easily deposited on a surface of the semiconductor layer.

For example, each of conditions of the dry-etching is selected from the respective one of ranges as below:
Output power: 10 to 1,000 W;
Pressure: 0.5 to 20 Pa; and
Flow rate of reactant gas: 1 to 200 sccm, preferably,
Output power: 50 to 500 W;
Pressure: 3 to 5 Pa; and
Flow rate of reactant gas: 5 to 120 sccm.

In the case where a mixed gas of $Cl_2$ and $SiCl_4$ is used for the reactant gas to form nitride semiconductor nanorods, for example, each of the conditions is selected from the respective one of following ranges: $Cl_2$ flow rate: 1 to 50 sccm, and $SiCl_4$ flow rate: 10 to 140 sccm; and preferably $Cl_2$ flow rate: 5 to 20 sccm, and $SiCl_4$ flow rate: 30 to 100 sccm.

The etching time is selected so that the nanorods have a desired height.

In the case where a mixed gas of $Cl_2$ and $SiCl_4$ is used for the reactant gas to form nitride semiconductor nanorods, for example, with the output power of 230 W, the pressure of 4 Pa, the $Cl_2$ flow rate of 10 sccm, and the $SiCl_4$ flow rate of 70 sccm, an etching rate of 43 nm/min is obtained. Using a mixed gas of $Cl_2$ and $SiCl_4$ as the reactant gas allows for increasing the etching rate of the nitride semiconductor compared with the case where $Cl_2$ is used. With this constitution, etching with small bias power can be performed, so that plasma damage to the nitride semiconductor can be reduced.

Also, for example, in the case of forming nanorods having a diameter of 50 nm to 300 nm, the pressure in the chamber 12 is selected from a range of, for example, 2 Pa to 4 Pa.

Mask-Removing Step

After dry etching, the masks are removed. The masks are removed using, for example, a solution of a strong inorganic acid such as nitric acid. For example, the masks can be removed with nitric acid in the case where yttria is used for the masking material, and the masks can be removed with sulfuric acid in the case where zirconia is used for the masking material.

In the method of forming nanorods according to the first embodiment, by continuing dry etching without changing conditions, autonomous shift from the early stage in which physical etching is active to a stage in which etching based on chemical reactions is dominant occurs as described above. After the shift, dry etching of the semiconductor layer on which the masks have been formed progresses. In this stage, mainly the three-dimensional shape of the nanorods, which are formed by etching, are determined in accordance with the etching conditions. For example, under the condition of high pressure, that is, low vacuum, side etching progresses, so that pillar-shaped nanorods are obtained. Under low pressure, that is, high vacuum, side etching is suppressed, so that conical or pyramidal nanorods are formed.

In the method of forming nanorods according to the first embodiment, the dry-etching conditions can be selected on the basis of, for example, a pre-created database in which the pressure in the chamber 12 is related to the shape and density of the nanorods to be formed with respect to a selected semiconductor material, masking material, and reactant gas. This database is, for example, created based on evaluations of the shape and density of the nanorods that are obtained by sequentially changing the pressure in the chamber 12 while conditions other than the pressure in the chamber 12 are fixed and performing dry-etching under each pressure. This database may be created based on evaluations of the shape and density of the nanorods under each pressure that are obtained by sequentially changing the conditions other than the pressure in the chamber 12 and sequentially changing the pressure in the chamber 12 for each set of the conditions under each pressure.

In the above method of forming nanorods in the first embodiment, the nanorods are formed by placing the base including the semiconductor layer and the masking material in the chamber, setting initial dry-etching conditions so that a desired shape and density are obtained, and allowing autonomous shift from the early stage in which mainly the masks are formed to the stage in which mainly the semiconductor is dry-etched.

Accordingly, with the method of forming nanorods in the first embodiment, the shape of the nanorods to be formed can be controlled through a simple process.

Second Embodiment

In the method of forming nanorods according to the first embodiment described above, the nanorods are formed by forming the masks in the dry-etching step and etching the semiconductor layer through the masks without changing the initial dry-etching conditions during the process.

On the other hand, a method of forming nanorods according to a second embodiment differs from the method according to the first embodiment in that the dry-etching conditions are different between the early stage in which the masks are formed and the stage in which the semiconductor layer on which the masks have been formed is dry-etched. The method of forming nanorods according to the second embodiment is substantially the same as the method of forming nanorods in the first embodiment except for the above point.

The above method of forming nanorods in the second embodiment allows for forming desired nanorods that meet more varying requests.

For example, as described above, the pressure in the chamber 12 is required to be decreased in the case of forming masks with a comparatively large diameter, that is, in the case of increasing the diameter of the nanorods to be formed. On the other hand, with low pressure, that is, high vacuum, side etching is suppressed, and the nanorods tend to be formed into a conical or pyramidal shape. Accordingly, forming pillar-shaped nanorods having a large diameter by the method of forming nanorods in the first embodiment may not be easy. Meanwhile, in the method of forming nanorods according to the second embodiment, the dry-etching conditions are different between the early stage in which the masks are formed and the stage in which the semiconductor layer on which the masks have been formed is dry-etched. With this method, for example, pillar-shaped nanorods having a large diameter can be easily formed. For example, masks having a large diameter are formed under a low pressure in the chamber 12, and the semiconductor layer is then etched into a pillar shape under the increased pressure in the chamber 12, so that pillar-shaped nanorods are formed.

In the method of forming nanorods according to the second embodiment, the etching conditions in the early stage in which the masks are formed can be selected on the basis of, for example, a pre-created database in which the pressure in the chamber 12 is related to the size of each of the masks to be formed on the surface of the semiconductor by the scattered masking material and distribution density of the masks with respect to a selected semiconductor material, masking material, and reactant gas. This database is, for example, created based on evaluations of the size of each of the masks to be formed on the surface of the semiconductor by the scattered masking material and distribution density of the masks that are obtained by sequentially changing the pressure in the chamber 12 while conditions other than the pressure in the chamber 12 are fixed and performing etching under each pressure. This database may be created based on evaluations of the size of each of the masks to be formed on the surface of the semiconductor by the scattered masking material and distribution density of the masks that are obtained by sequentially changing the conditions other than the pressure in the chamber 12 and sequentially changing the pressure in the chamber 12 with respect to each set of conditions under each pressure.

The dry-etching conditions in the stage of dry-etching the semiconductor layer after forming the masks can be selected on the basis of a pre-created database in which the pressure in the chamber 12 is related to a degree of anisotropic etching (i.e., ratio of etching in the depth direction to side etching) with respect to a selected semiconductor material, masking material, and reactant gas. This database is, for example, created based on evaluations of the degree of anisotropic etching at each pressure obtained by sequentially changing the pressure in the chamber 12 while the conditions other than the pressure in the chamber 12 are fixed. This database may also be created based on evaluations of the degree of anisotropic etching at each pressure obtained by sequentially changing the conditions other than the pressure in the chamber 12, and sequentially changing the pressure in the chamber 12 for each set of conditions.

In the method of forming nanorods according to the second embodiment described above, the pressure in the chamber in the early stage of etching in which the masks are formed differs from the pressure in the chamber at the time of etching the semiconductor layer using the masks, nanorods having a desired shape can be formed more easily at a desired density.

In the above method of forming nanorods according to the second embodiment, the etching conditions other than the pressure in the chamber in the early stage in which the masks are formed may differ from the dry-etching conditions other than the pressure in the chamber at the time of etching the semiconductor layer using the masks, while the pressure in the chamber in the early stage in which the masks are formed is different from the pressure in the chamber at the time of etching the semiconductor layer using the masks or while the pressure in the chamber is unchanged.

Third Embodiment

Figure 2:
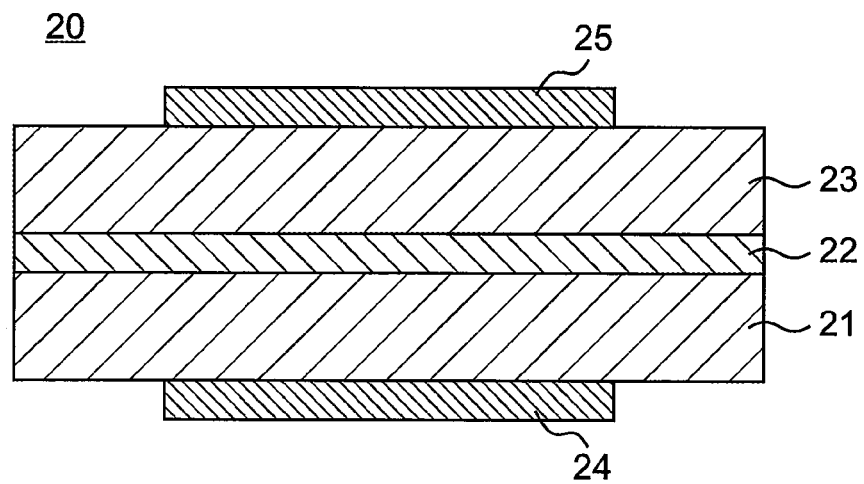
FIG. 2 is a schematic sectional view of a semiconductor element according to a third embodiment of the present invention.

FIG. 2 is a schematic cross-sectional view of a semiconductor element 20 manufactured by a method according to a third embodiment of the present invention. FIG. 3 is a schematic enlarged cross-sectional view of a portion of FIG. 2. The semiconductor element 20 is, for example, a laser element and includes an n-side semiconductor layer 21, an n-electrode 24 on a lower surface of the n-side semiconductor layer 21, a p-side semiconductor layer 23, a p-electrode 25 on an upper surface of the p-side semiconductor layer 23, and an active layer 22 between the n-side semiconductor layer 21 and the p-side semiconductor layer 23. In particular, as shown in FIG. 3, the active layer 22 includes a plurality of nanorods 22n each including barrier layers 22b and well layers 22w alternately layered, and an insulating member 22i embedded in the gaps between the nanorods 22n. The nanorods 22n are formed by the method of forming nanorods in the first or second embodiment. The n-side semiconductor layer 21 includes an n-type semiconductor layer (i.e., first conductive-type semiconductor layer), and the p-side semiconductor layer 23 includes a p-type semiconductor layer (i.e., second conductive-type semiconductor layer).

In the active layer 22, the nanorods 22n each include, for example, an n-side barrier layer with a thickness of 250 nm, a first well layer with a thickness of 3 nm, a middle barrier layer with a thickness of 2 nm, a second well layer with a thickness of 3 nm, and a p-side barrier layer with a thickness of 250 nm. Alternatively, the lower end of each nanorods 22n may be located in the n-side barrier layer, and the nanorod 22n can have a height of, for example, about 260 to 510 nm. In the active layer 22, the insulating member 22i can be made of, for example, an oxide such as $SiO_2$ or a nitride such as AlN.

In the case where the semiconductor element that includes the active layer 22 including the nanorods 22n as described above is applied to, for example, a light-emitting element, emission efficiency of the light emitting element can be improved by the quantum confinement effect.

A method of manufacturing the semiconductor element 20 will be described below.

First, the n-side semiconductor layer 21 and the active layer are epitaxially grown on a growth substrate. For example, in the case where a nitride-semiconductor light-emitting element is produced for a semiconductor element 20, a sapphire substrate or an n-type GaN substrate can be used for the growth substrate. The n-side semiconductor layer 21 and the active layer are made of, for example, a nitride semiconductor represented by the general formula $In_xAl_yGa_{1-x-y}N$ ($0 \leq x \leq 1$, $0 \leq y \leq 1$, $0 \leq x+y \leq 1$).

Subsequently, nanorods are formed in the active layer using the method of forming nanorods according to the first or second embodiment, and the masks (i.e., masking material that has adhered in the early stage of dry etching) used for forming the nanorods are removed by, for example, washing with a strong acid. Each of the nanorods has a height similar to the thickness of the active layer 22. The lower end of each of the nanorods may be located at an inside of the n-side barrier layer in the active layer 22.

Subsequently, the gaps between the nanorods are filled with the insulating member.

More specifically, the insulating member 22i is disposed such that the nanorods 22n are completely embedded therein as shown in FIG. 4A. For the insulating member charged between the nanorods, an insulating inorganic material such as $SiO_2$ or AlN, which has good stability at a high temperature, is preferably used in view of exposure to a high temperature during the epitaxial growth of the p-side semiconductor layer in a later step. Example of the method of forming or charging an insulating inorganic material such as $SiO_2$ or AlN in the gaps between the nanorods include sputtering, chemical vapor deposition (CVD), and electron cyclotron resonance (ECR). In the case where $SiO_2$ is used, for example, a liquid $SiO_2$ material called spin-on glass (SOG) may be charged between the nanorods.

Subsequently, a portion of the insulating member 22i is removed such that a top portion and a portion near the top portion of each of the nanorods 22n are exposed as shown in FIG. 4B. In the removing of a portion of the insulating member 22i, the top portion and a portion near the top portion of each of the nanorods 22n are exposed, and it is preferable that the nanorods 22n be removed as little as possible while the insulating member 22i is removed. The insulating member 22i can be removed by, for example, dry etching or wet etching.

The reactant gas used in dry etching or the etchant used in wet etching is selected as appropriate so that the gas or etchant can remove substantially a portion of the insulating member 22i only. For example, in the case where $SiO_2$ is used for the insulating member, the insulating member can be removed by dry etching using a reactant gas such as $CHF_3$ and $CF_4$. In the case where AlN is used for the insulating member, the insulating member can be removed by wet etching using an etchant such as KOH and NaOH. Under such conditions that allow substantially only a portion of the insulating member 22i to be removed, upper portions of the nanorods are exposed from the insulating member 22i as shown in FIG. 4B. The upper portions of the nanorods exposed from the insulating member 22i has a length of, for example, about 5 nm or less.

The p-side semiconductor layer is then epitaxially grown on the nanorods 22n and the insulating member 22i. In the case of producing a nitride-semiconductor light-emitting element, the p-side semiconductor layer is made of, for example, a nitride semiconductor represented by the general formula $In_xAl_yGa_{1-x-y}N$ ($0 \leq x \leq 1$, $0 \leq y \leq 1$, $0 \leq x+y \leq 1$). The growth of the p-side semiconductor layer is referred to as "regrowth" because epitaxial growth is temporarily interrupted after epitaxially growing the n-side semiconductor layer 21 and the active layer to form the nanorods 22n and the insulating member 22i, after which the epitaxial growth is restarted.

Finally, a p-electrode 35 and an n-electrode 34 are formed.

The semiconductor element 20 is manufactured as described above.

In the case where the semiconductor element 20 is produced to be a laser element, for example, a ridge having a longitudinal direction that is perpendicular to a height direction of the nanorods is formed, and reflective films such as dielectric multilayer films are formed at both end portions of the ridge.

Fourth Embodiment

FIG. 5 is a schematic cross-sectional view of a semiconductor element 30 manufactured using a method according to a fourth embodiment of the present invention.

The semiconductor element 30 according to the fourth embodiment is, for example, a laser element, and includes an n-side semiconductor layer 31, an n-electrode 34 on a lower surface of the n-side semiconductor layer 31, a p-side semiconductor layer 33, a p-electrode 35 on an upper surface of the p-side semiconductor layer 33, and an active layer 32 disposed between the n-side semiconductor layer 31 and the p-side semiconductor layer 33. In particular, the semiconductor element according to the fourth embodiment differs from the semiconductor element 20 according to the third embodiment in that nanorods 37n each include an n-side-semiconductor rod portion 31n, an active-layer rod portion 32n, and a p-side-semiconductor rod portion 33n as shown in FIG. 6A. The semiconductor element according to the fourth embodiment is produced as below.

In the manufacturing method according to the fourth embodiment, first, the n-side semiconductor layer 31, the active layer 32, and the p-side semiconductor layer 33 are epitaxially grown on a growth substrate (such as an n-type GaN substrate).

Subsequently, the nanorods 37n including the p-side semiconductor layer 33, active layer 32, and n-side semiconductor layer 31 are formed using the method of forming nanorods according to the first or second embodiment. After forming the nanorods 37n, the masks (i.e., masking material that has adhered in the early stage of dry etching) used for forming the nanorods are removed by, for example, washing with a strong acid.

Subsequently, the gaps between the nanorods 37n are filled with an insulating member.

More specifically, first, an insulating member 36i is arranged such that the nanorods 37n are completely embedded therein as shown in FIG. 6A. An insulating inorganic material such as $SiO_2$ or AlN can be used for the insulating member 36i charged between the nanorods 37n. The manufacturing method according to the fourth embodiment differs from the method according to the third embodiment in that the p-side semiconductor layer has already been epitaxially grown, an insulating resin can be used without being exposed to a high temperature. The fourth embodiment differs from the third embodiment in that the nanorods 37n each include the p-side semiconductor layer 33 and the n-side semiconductor layer 31 as well as the active layer 32, so that the nanorods 37n each have a length greater than a length of each of the nanorods 22n in third embodiment. Accordingly, an insulating resin that is easily charged between the nanorods 37n compared with inorganic materials is preferably used for the insulating member 36i in the fourth embodiment. Examples of such as insulating resin include para-xylylene resins.

Subsequently, a portion of the insulating member 36i is removed so that a top portion and a portion near the top portion of the nanorods 37n are exposed as shown in FIG. 6B. In the case where an insulating inorganic material such as $SiO_2$ or AlN is used for the insulating member 36i, the removing of a portion of the insulating member 36i can be performed in substantially the same manner as in the third embodiment. In the case where an insulating resin is used for the insulating member 36i, the removal can be performed by, for example, dry etching using a gas such as $O_2$. In order to reduce the contact resistance with the p-electrode, an upper portion of each of the nanorods 37n exposed from the insulating member preferably has a length greater than that of the nanorods 22n in the third embodiment. The length of the upper portion of each of the nanorods 37n is, for example, about 30 nm.

The p-electrode 35 is then formed so as to have contact with and cover the nanorods 37n and the insulating member 36i as shown in FIG. 6C.

Then, the n-electrode 34 is formed.

The semiconductor element 30 is manufactured as described above.

In the case where the semiconductor element 30 is produced to be a laser element, for example, a p-electrode having a longitudinal direction that is perpendicular to a height direction of each of the nanorods is formed to define a waveguide region, and reflective films such as dielectric multilayer films are formed at both ends of the waveguide region.

In the semiconductor element 30 produced as described above, the n-side semiconductor layer 31 includes a second n-side semiconductor layer 31b on an n-electrode 34 side and a first n-side semiconductor layer 31a on an active layer 32 side as shown in FIG. 5. The first n-side semiconductor layer 31a includes the n-side-semiconductor rod portions 31n and the insulating member 36i, the active layer 32 includes the active-layer rod portions 32n and the insulating member 36i, and the p-side semiconductor layer 33 includes the p-side-semiconductor rod portions 33n and the insulating member 36i.

With the semiconductor element 30 according to the fourth embodiment having the above constitution in which the active layer 32 includes the nano-sized active-layer rod portions 32n, in the case where the semiconductor element 30 is applied to, for example, a light-emitting element, the emission efficiency of the light emitting element can be improved by the quantum confinement effect.

Fifth Embodiment

Figure 7:
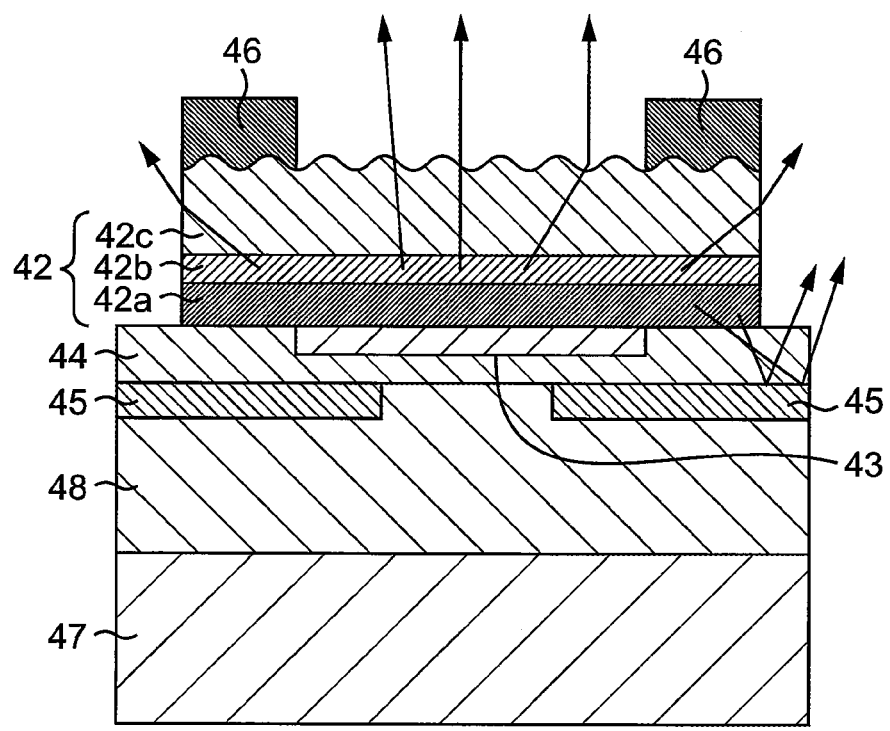
FIG. 7 is a schematic cross-sectional view of the semiconductor element according to a fifth embodiment of the present invention.

FIG. 7 is a schematic cross-sectional view of a semiconductor element 40 manufactured using a method according to a fifth embodiment of the present invention. The semiconductor element 40 is, for example, a light-emitting diode and includes a support substrate 47 and a semiconductor layered structure 42 disposed on the support substrate 47 via a conductive layer 48 disposed therebetween. The semiconductor layered structure 42 includes, for example, a p-side semiconductor layer 42a, an active layer 42b, and an n-side semiconductor layer 42c in this order from a support substrate 47 side. In the semiconductor element 40, n-electrodes 46 are disposed on a portion of the upper surface of the semiconductor layered structure 42 such that the n-electrodes 46 is in contact with the n-side semiconductor layer 42c. A p-electrode 43 is disposed on a lower surface, which is on the support substrate 47 side, of the semiconductor layered structure 42 such that the p-electrode 43 is in contact with the p-side semiconductor layer 42a.

In the semiconductor element 40, the lower surface of the semiconductor layered structure 42 is bonded to the support substrate 47 via the conductive layer 48, a reflective film 45, and a protective film 44. More specifically, the conductive layer 48 has a projecting portion 48p having an upper surface that is bonded to a lower surface of the p-electrode 43. The reflective films 45 and the protective films 44 are disposed in this order from a conductive layer 48 side, between portions of the conductive layer 48 except for the projecting portion 48p and the semiconductor layered structure 42. The reflective films 45 may not be disposed. Also, the protective films 44 may not be disposed, and the p-electrode 43 may be disposed on substantially an entirety of a lower surface of the p-side semiconductor layer 42a instead.

In particular, in the semiconductor element 40, an upper surface (surface of the n-side semiconductor layer 42c), on which the n-electrodes 46 are formed, of the semiconductor layered structure 42 is an irregular surface including a plurality of nanorods.

With the semiconductor element 40 according to the fifth embodiment having the above constitution in which the surface of the n-side semiconductor layer 42c, which is the main emitting surface, is an irregular surface (rough surface) including nanorods, light extraction efficiency can be increased.

In the semiconductor element 40 according to the fifth embodiment, a surface of the n-side semiconductor layer 42c can be roughened by forming nanorods on the surface of the n-side semiconductor layer 42c using the method of forming nanorods according to the first or second embodiment before forming of the n-electrodes 46.

EXAMPLES

Certain examples according to embodiments of the present invention will be described below.

Example 1

First, a GaN layer having a thickness of about 5 μm was formed on the +C-plane of a GaN substrate.

Subsequently, the semiconductor wafer was placed on a wafer table made of yttria and dry-etched with an RIE apparatus. $Cl_2$ and $SiCl_4$ were used for a reactant gas, and etching conditions of an output power of 230 W, a pressure of 4 Pa, a $Cl_2$ flow rate of 10 sccm, and a $SiCl_4$ flow rate of 70 sccm were employed. The etching time was 16 minutes. Under such conditions, nanorods having a diameter of about 70 nm and a height of about 700 nm were formed.

After that, the wafer was allowed to soak in nitric acid for five minutes, and then washed with water and dried, so that yttria having deposited as masks on the nanorods is removed.

Figure 8:
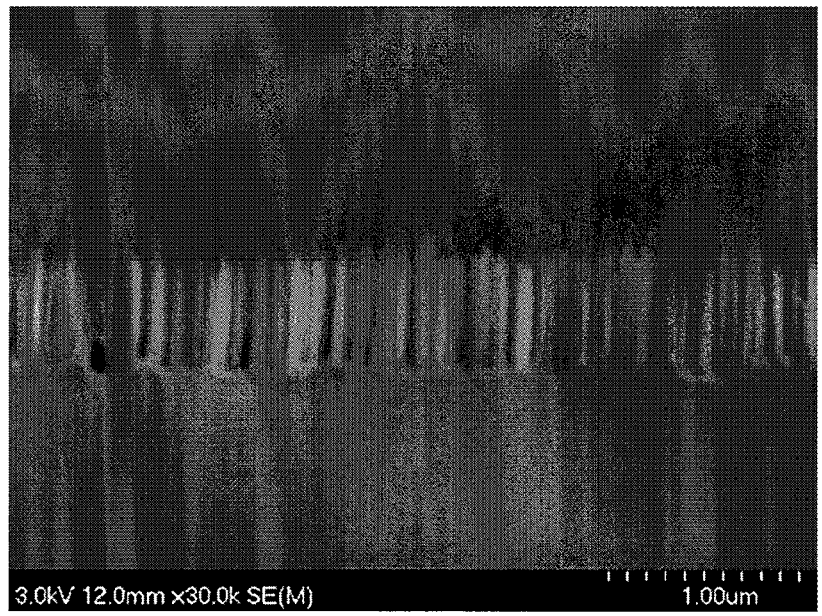
FIG. 8 is a photograph of nanorods in Example 1 formed under a pressure during dry etching of 4 Pa.

FIG. 8 shows the nanorods that were obtained in Example 1. FIG. 8 is a SEM image captured by a scanning electron microscope (SEM).

As shown in FIG. 8, in Example 1, pillar-shaped nanorods were formed, which are suitable for use as the nanorods included in the active layer in the third or fourth embodiment.

Example 2

In Example 2, nanorods were formed in substantially the same manner as in Example 1 except that the semiconductor wafer was replaced with an n-type semiconductor layer, an active layer, and a p-type semiconductor layer layered in this order on the +C-plane of a GaN substrate. In other words, in Example 2, the nanorods were formed in the p-type semiconductor layer. The p-type semiconductor layer included a Mg-doped GaN/AlGaN superlattice clad layer and a Mg-doped GaN contact layer. The n-type semiconductor layer included a Si-doped AlGaN clad layer. The active layer included an n-side barrier layer with a thickness of about 250 nm, a first well layer with a thickness of about 3 nm, a middle barrier layer with a thickness of about 2 nm, a second well layer with a thickness of about 3 nm, and a p-side barrier layer with a thickness of about 250 nm. The first well layer and the second well layer had compositions that can emit blue light with a wavelength of about 455 nm.

Figure 13:
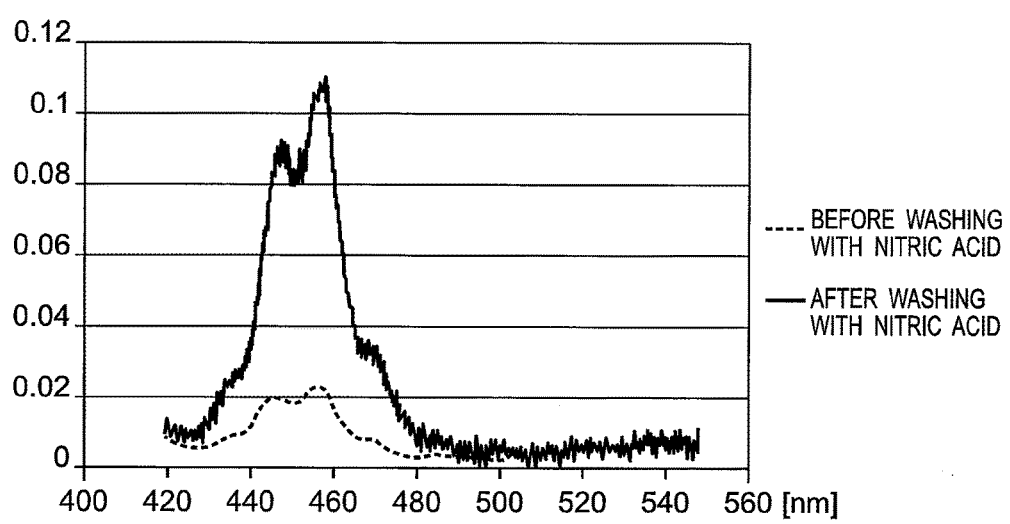
FIG. 13 is a graph showing PL intensities before and after washing nanorods according to Example 2 with nitric acid.

Also in Example 2, nanorods having substantially the same shape as in the Example 1 were obtained. In addition, in Example 2, photoluminescence (PL) intensities of a sample in which the nanorods were formed, before and after washing with nitric acid, were evaluated. As a result, as shown in FIG. 13, it was confirmed that the PL intensity was low before washing with nitric acid and high after washing with nitric acid. This result shows that yttria that was deposited on a surface of the semiconductor layer was left between forming the nanorods and washing with nitric acid, that is, yttria that was deposited on the surface of the semiconductor layer functioned as masks.

Example 3

In Example 3, nanorods were formed in substantially the same manner as in Example 1 except that the pressure in dry etching was 8 Pa.

Figure 9:
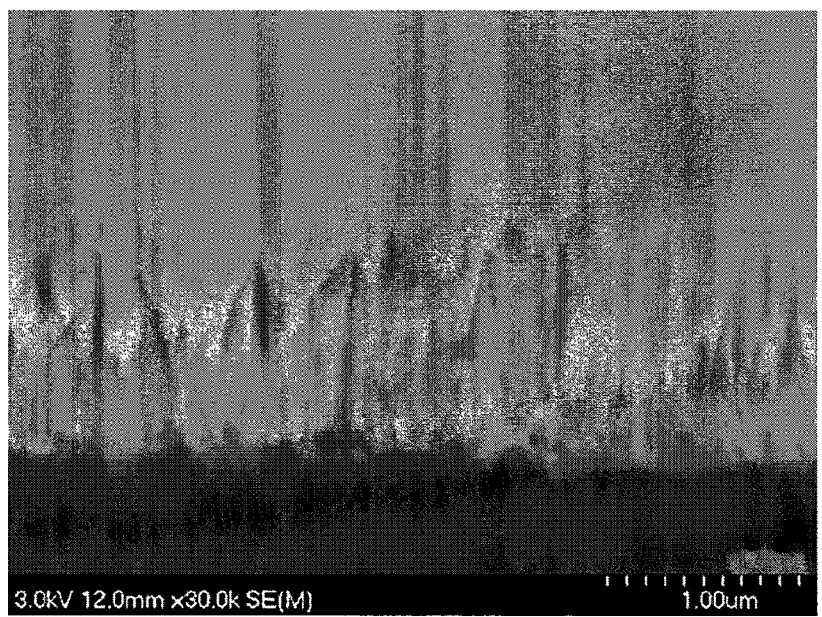
FIG. 9 is a photograph of nanorods in Example 3 formed under a pressure during dry etching of 8 Pa.

The SEM image in FIG. 9 shows the nanorods obtained in Example 3.

As shown in FIG. 9, acicular nanorods were formed in Example 3. These nanorods can be used for, for example, forming the irregular surface that allows for improving the light extraction efficiency in the fifth embodiment.

Example 4

In Example 4, nanorods were formed in substantially the same manner as in Example 1 except that the pressure in dry etching was 1 Pa.

Figure 10:
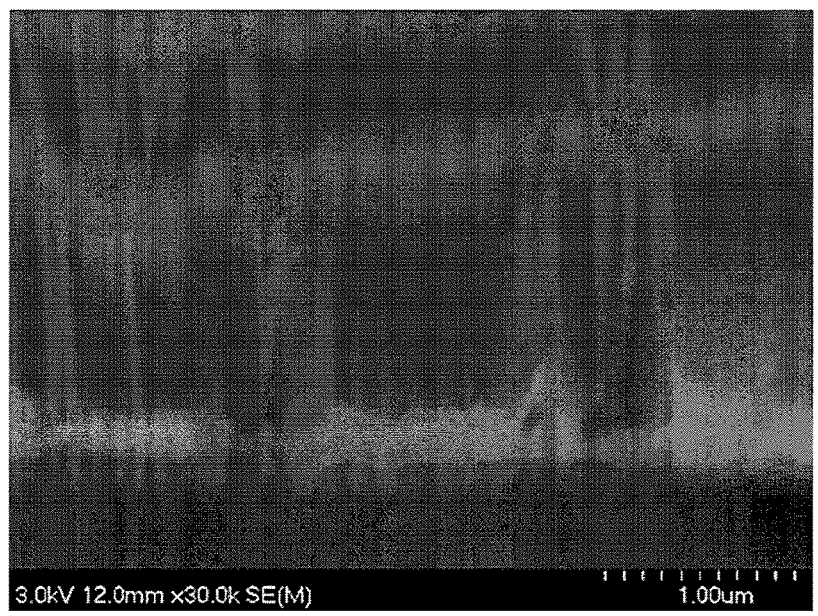
FIG. 10 is a photograph of nanorods in Example 4 formed under a pressure during dry etching of 1 Pa.

The SEM image in FIG. 10 shows the nanorods that were obtained in Example 4.

Example 5

In Example 5, nanorods were formed in substantially the same manner as in Example 1 except that a GaN layer was formed on the −C-plane of a GaN substrate to produce a semiconductor wafer.

Figure 11:
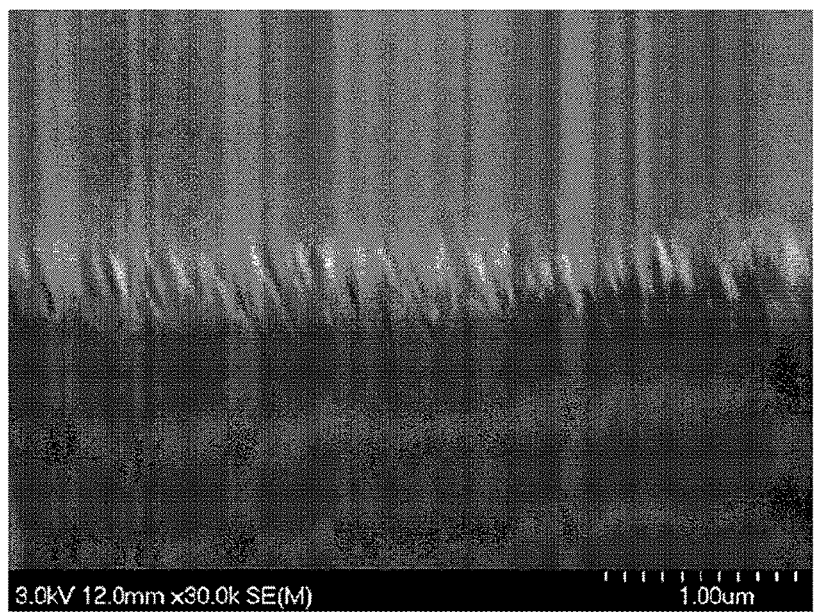
FIG. 11 is a photograph of nanorods in Example 5 formed on the −C-plane of a GaN substrate.

The SEM image in FIG. 11 shows the nanorods obtained in Example 5.

As shown in FIG. 11, conical-like nanorods were formed in Example 5. Such nanorods can be used for, for example, forming the irregular surface that allows for improving the light extraction efficiency described in the fifth embodiment. The nanorods appear to be inclined in the SEM image in FIG. 11, but this inclination is attributed to conditions for capturing the SEM image. The nanorods obtained in Example 5 had a shape close to a symmetric conical shape.

Comparative Example 1

In Comparative Example 1, a method was performed in substantially the same manner as in Example 1 except that the semiconductor wafer was placed on a wafer table made of quartz and dry-etched.

Figure 12:
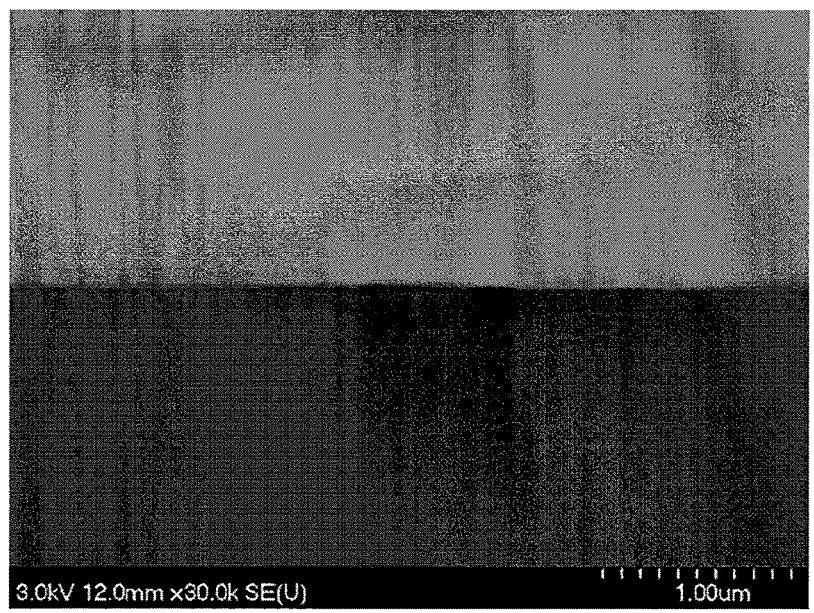
FIG. 12 is a photograph of Comparative Example 1 in which a semiconductor wafer is placed on a wafer table made of quartz to form nanorods.

However, as shown in FIG. 12, no nanorods were formed in Comparative Example 1.

Example 6

Example 6 describes how a laser element may be produced including nanorods produced including nanorods produced in substantially the same manner as in Example 1.

More specifically, first, an n-type semiconductor layer and an active layer are formed in this order on the +C-plane of a GaN substrate to produce a semiconductor wafer. In Example 6, the n-type semiconductor layer includes a Si-doped AlGaN clad layer, and the active layer includes an n-side barrier layer with a thickness of about 250 nm, a first well layer with a thickness of about 3 nm, a middle barrier layer with a thickness of about 2 nm, a second well layer with a thickness of about 3 nm, and a p-side barrier layer with a thickness of about 250 nm.

Subsequently, nanorods are formed in the semiconductor wafer in substantially the same manner as in Example 1. The lower ends of the nanorods are located in the n-side barrier layer at this time.

AlN, which is an insulator, is then formed on the semiconductor wafer in which the nanorods have been formed in order to insulate between a p-type semiconductor layer and the n-type semiconductor layer, and AlN is wet-etched with KOH such that an upper portion of each of the nanorods is exposed. That is, the gaps between the nanorods are filled with AlN such that the active layer is not completely embedded.

After that, crystal growth is performed to form the p-type semiconductor layer, and components such as a stripe-shaped ridge and electrodes are formed, so that the laser element is obtained. The p-type semiconductor layer includes a Mg-doped GaN/AlGaN superlattice clad layer and a Mg-doped GaN contact layer.

Example 7

Example 7 describes how a laser element may be produced including nanorods produced in substantially the same manner as in Example 1.

More specifically, first, an n-type semiconductor layer, an active layer, and a p-type semiconductor layer are formed in this order on the +C-plane of a GaN substrate to produce a semiconductor wafer. The n-type semiconductor layer, the active layer, and the p-type semiconductor layer are substantially the same as in Example 6.

Subsequently, nanorods are formed in the semiconductor wafer in substantially the same manner as in Example 1. The lower ends of the nanorods are located at a surface of the n-type semiconductor layer at this time.

The semiconductor wafer in which the nanorods have been formed is then coated with a para-xylylene resin, which is an insulator, to fill the gaps between the nanorods and to flatten the surface such that an upper portion of each of the nanorods is exposed, that is, such that the p-type semiconductor layer is not completely embedded, in order to insulate between the p-type semiconductor layer and the n-type semiconductor layer.

After that, components such as a stripe-shaped ridge and electrodes are formed, so that the laser element is obtained.

Example 8

Example 8 describes how an LED element may be produced including nanorods according to one embodiment of the present invention.

First, a GaN layer and an n-type contact layer that is made of Si-doped n-type AlGaN are grown on a growth substrate made of sapphire (C-plane) via a buffer layer, so that an n-side semiconductor layer 42c is formed.

Subsequently, barrier layers made of undoped AlGaN and well layers made of undoped InGaN are alternately grown to form an active layer 42b, which is a light-emitting layer.

Subsequently, a Mg-doped p-type AlGaN layer and a p-type contact layer that is made of Mg-doped p-type AlGaN are grown to form a p-side semiconductor layer 42c.

A semiconductor layered structure 42 is formed as described above.

Subsequently, a p-electrode 43 is formed on a portion of a surface of the p-type contact layer of the semiconductor layered structure 42.

$SiO_2$ layers that serve as protective films 44 is formed on portions of the surface of the p-type contact layer on which the p-electrode 43 is not formed, and reflective films 45 made of Al are formed on the protective films 44.

A bonding metal layer is formed to cover the p-electrode 43 and the reflective films 45.

Separately, a support substrate 47 made of CuW and having a thickness of 200 μm is provided. A bonding metal layer is formed on a surface of the support substrate 47.

Subsequently, the bonding metal layer on the semiconductor layered structure 42 is bonded to the bonding metal layer on the support substrate 47. After bonding, the bonding metal layer on the semiconductor layered structure 42 and the bonding metal layer on the support substrate 47 are unified into a conductive layer 48 containing AuSn.

After that, the growth substrate and the buffer layer at a side opposite to the support substrate 47 are removed to expose a surface of the n-type contact layer made of n-type AlGaN at an upper side of the p-side semiconductor layer 42c.

The exposed surface of the n-type contact layer is dry-etched using an RIE apparatus with $Cl_2$ and $SiCl_4$, which are used as the reactant gas. For etching conditions, an output power of 230 W, a pressure of 4 Pa, a $Cl_2$ flow rate of 10 sccm, and a $SiCl_4$ flow rate of 70 sccm are employed. The etching time is 16 minutes. Nanorods having a height of about 700 nm are formed on the surface of the n-type contact layer through this process.

After that, soaking in nitric acid for five minutes and then washing with water and drying are performed to remove yttria having deposited as masks on the nanorods.

Subsequently, n-electrodes 46 are formed on a portion of the surface of the n-type contact layer on which the nanorods have been formed.

With the nanorods formed on the surface of the n-type contact layer, which constitutes the main emitting surface, the LED element in Example 8 produced as described above may have a higher emission efficiency than in the case where no nanorods are disposed.

What is claimed is:

1. A method of forming semiconductor nanorods, the method comprising:
   placing, in a chamber, a masking material member and a base comprising a semiconductor, wherein the masking material member is located apart from an upper surface of the semiconductor onto which masking material particles are to be deposited, and wherein an etching rate of the masking material member in a chemical reaction with a reactant gas during dry etching is lower than an etching rate of a semiconductor in a chemical reaction with the reactant gas during dry etching; and
   while the masking material member is located apart from the upper surface of the semiconductor onto which the masking material particles are to be deposited, performing dry-etching so as to (i) scatter the masking material particles away from a surface of the masking material member such that the masking material particles that have been scattered away from the surface of the masking material member are deposited on the upper surface of the semiconductor and form a plurality of dot-masks on the upper surface of the semiconductor, and (ii) remove a portion of the semiconductor exposed from the dot-masks.

2. The method of forming nanorods according to claim 1, wherein the semiconductor comprises a nitride semiconductor.

3. The method of forming nanorods according to claim 2, wherein the upper surface of the semiconductor on which the dot-masks are formed is a +C-plane.

4. The method of forming nanorods according to claim 1, wherein the masking material member comprises yttria or zirconia.

5. The method of forming nanorods according to claim 1, wherein performing the dry-etching comprises changing a pressure in the chamber after the dry-etching is started and before the dry-etching is complete.

6. The method of forming nanorods according to claim 5, wherein the pressure is changed after the dot-masks are formed, but before completion of the removal of said portion of the semiconductor exposed from the dot-masks.

7. The method of forming nanorods according to claim 2, wherein performing the dry-etching comprises changing a pressure in the chamber after the dry-etching is started and before the dry-etching is complete.

8. The method of forming nanorods according to claim 7, wherein the pressure is changed after the dot-masks are formed, but before completion of the removal of said portion of the semiconductor exposed from the dot-masks.

9. The method of forming nanorods according to claim 3, wherein performing the dry-etching comprises changing a pressure in the chamber after the dry-etching is started and before the dry-etching is complete.

10. The method of forming nanorods according to claim 9, wherein the pressure is changed after the dot-masks are formed, but before completion of the removal of said portion of the semiconductor exposed from the dot-masks.

11. The method of forming nanorods according to claim 4, wherein performing the dry-etching comprises changing a pressure in the chamber after the dry-etching is started and before the dry-etching is complete.

12. The method of forming nanorods according to claim 11, wherein the pressure is changed after the dot-masks are formed, but before completion of the removal of said portion of the semiconductor exposed from the dot-masks.

13. The method of forming nanorods according to claim 1, wherein placing the masking material member and the base comprises:
   disposing the base on a tray comprising the masking material member.

14. A method of manufacturing a semiconductor element, the method comprising the method of forming nanorods according to claim 1.

15. The method of manufacturing a semiconductor element according to claim 14,
   wherein the semiconductor of the base comprises, in this order:
   a first conductive type semiconductor layer,
   an active layer, and
   a second conductive type semiconductor layer different from the first conductive type semiconductor layer, and
   wherein, in performing the dry-etching, the dot-masks are formed on the first conductive type semiconductor layer, and at least a portion of the first conductive type semiconductor layer is removed to form the nanorods.

16. The method of manufacturing a semiconductor element according to claim 15, further comprising:
   forming an electrode on a surface of the first conductive type semiconductor layer on which the nanorods are formed, the electrode being in contact with the first conductive type semiconductor layer.

* * * * *